United States Patent
Madurawe et al.

(10) Patent No.: US 9,564,464 B2
(45) Date of Patent: Feb. 7, 2017

(54) MONOLITHICALLY STACKED IMAGE SENSORS

(71) Applicant: SEMICONDUCTOR COMPONENTS INDUSTRIES, LLC, Phoenix, AZ (US)

(72) Inventors: Raminda Madurawe, Sunnyvale, CA (US); Irfan Rahim, Milpitas, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/729,606

(22) Filed: Jun. 3, 2015

(65) Prior Publication Data

US 2016/0358967 A1 Dec. 8, 2016

(51) Int. Cl.
*H04N 5/378* (2011.01)
*H01L 27/146* (2006.01)

(52) U.S. Cl.
CPC ..... *H01L 27/14634* (2013.01); *H01L 27/1464* (2013.01); *H01L 27/1469* (2013.01); *H01L 27/14636* (2013.01); *H01L 27/14645* (2013.01); *H01L 27/14687* (2013.01); *H04N 5/378* (2013.01)

(58) Field of Classification Search
CPC ............. H01L 27/14634; H01L 27/14645; H01L 27/14636; H01L 27/1469; H01L 27/14687; H01L 27/1464; H04N 5/378
See application file for complete search history.

(56) References Cited

U.S. PATENT DOCUMENTS

| 5,573,964 A | 11/1996 | Hsu et al. |
| 5,650,655 A * | 7/1997 | Dennison ............... H01L 27/11 257/382 |
| 6,392,271 B1 | 5/2002 | Alavi et al. |
| 6,624,032 B2 | 9/2003 | Alavi et al. |
| 7,518,189 B1 | 4/2009 | Hackler et al. |
| 8,796,085 B2 | 8/2014 | Koldiaev et al. |
| 9,319,606 B2 * | 4/2016 | Nakata ............... H04N 5/35563 |

(Continued)

OTHER PUBLICATIONS

Saraswat et al., "3-Dimensional ICs: Motivation, Performance Analysis and Technologoy", Stanford University, Stanford, California, Litho Workshop, 2009, 38 pages.

(Continued)

*Primary Examiner* — Hung Lam
(74) *Attorney, Agent, or Firm* — Treyz Law Group, P.C.; Jason Tsai; Joseph F. Guihan (57) ABSTRACT

An imaging system may be formed from multiple stacked wafers. A first wafer may include backside illuminated photodiodes, floating diffusion regions, and charge transfer gate structures. The first wafer may be bonded to a second wafer that includes pixel trunk transistors such as reset transistors, source-follower transistors, row-select transistors and associated logic circuits. The pixel trunk transistors may be formed using bottom-gate thin-body transistors. The first and second wafers may share the same backend metallization layers. The second wafer may further be bonded to a third wafer that includes digital signal processing circuits. The digital signal processing circuits may also be implemented using bottom-gate thin-body transistors. Additional metallization layers may be formed over the third wafer. The first, second, and third wafers may be fabricated using the same or different technology nodes.

20 Claims, 11 Drawing Sheets (56) References Cited

U.S. PATENT DOCUMENTS

| 2011/0133061 | A1* | 6/2011 | Yu | B82Y 15/00 |
| | | | | 250/214.1 |
| 2012/0153419 | A1* | 6/2012 | Itonaga | H01L 21/76898 |
| | | | | 257/432 |
| 2012/0187516 | A1* | 7/2012 | Sato | H01L 27/1461 |
| | | | | 257/443 |
| 2014/0103414 | A1 | 4/2014 | Koldiaev et al. | |
| 2015/0281613 | A1* | 10/2015 | Vogelsang | H04N 5/35545 |
| | | | | 348/300 |
| 2016/0043120 | A1* | 2/2016 | Ahn | H01L 27/1463 |
| | | | | 257/229 |

OTHER PUBLICATIONS

Coudrain et al., "Towards a Three-Dimensional Back-Illuminated Miniaturized CMOS Pixel Technology using 100nm Inter-Layer Contacts" 3CEA Leti-MINATEC, Grenoble, France, 4 pages.

* cited by examiner

MONOLITHICALLY STACKED IMAGE SENSORS

BACKGROUND

This relates generally to imaging systems, and more particularly, to imaging systems with stacked integrated circuit dies.

Modern electronic devices such as cellular telephones, cameras, and computers often use digital image sensors. An image sensor includes a two-dimensional array of image sensing pixels. Each pixel typically includes a photosensitive element such as a photodiode that receives incident photons (light) and converts the photons into electrical signals. Configurations of a stacked imaging system in which a CMOS image sensor die is stacked on top of a digital signal processor (DSP) have been developed to help separate the formation of the analog image sensor circuitry such as photodiode structures and the formation of the digital pixel transistor circuitry into separate integrated circuit dies.

In one conventional stacked arrangement as described by Coudrain et al. (see, "Towards a Three-Dimensional Back-Illuminated Miniaturized CMOS Pixel Technology using 100 nm Inter-Layer Contacts," incorporated herein as a reference), a backside illuminated silicon wafer is monolithically bonded to Silicon on Insulator (SOI) pixel transistors. Photodiodes are first formed in the silicon wafer, which is then bonded and thinned down to construct the SOI pixel transistors above the photodiodes. Formed in this way, the area above the photodiodes is occupied by the SOI pixel transistor (which restricts metal line routing for 3D logic integration), and the thermal cycles that are used to form the SOI transistors can negatively affect the doping of the photodiode and degrade well capacity. Moreover, the photodiodes and the SOI pixel transistors are bound by the same CMOS processing limitations.

In another conventional stacked arrangement as described by Saraswat et al. (see, "3-Dimensional ICs: Motivation, Performance Analysis and Technology," incorporated herein as a reference), a fully processed pixel wafer is adhesively bonded to a fully processed analog/digital companion wafer. Forming a stacked image system in this way, however, is costly since both wafers require expensive transistor and metal processing steps, offers poor wafer-to-wafer interconnect density, and requires use of large and deep through-silicon via connections that affect color-filter-array (CFA) processing.

It is within this context that the embodiments described herein arise.

DETAILED DESCRIPTION

Embodiments of the present invention relate to image sensors, and more particularly, to stacked image sensors with bottom-gate thin-body transistors. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
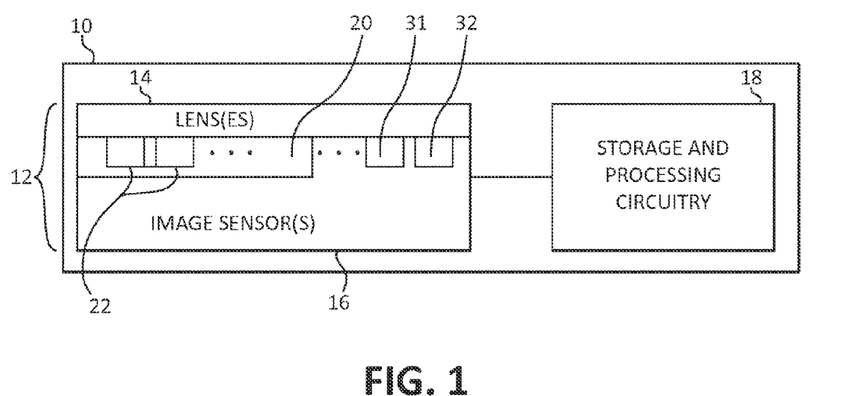
FIG. 1 is a diagram of an illustrative imaging system that may include a camera module having an image sensor in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a frontside illumination (FSI) image sensor or a backside illumination (BSI) image sensor. If desired, camera module 12 may be provided with an array of lenses 14 and an array of corresponding image sensors 16. Lens structures 14 may include at least one macrolens (sometimes referred to as a camera lens) for directing incoming light to a corresponding array of smaller microlenses each of which is formed over a respective image sensor pixel (see, e.g., pixels 22).

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

As we approach the limits of photolithography to pattern ever smaller gate lengths with each successive technology node, chip stacking techniques such as 3D bonding and 3D packaging have been introduced in an effort to keep up with Moore's law. Problems associated with current state-of-the-art stacking solutions are described in the Background section. In an effort to provide low cost, high performance, and low power 3D stacking for imaging systems, a bottom-gate thin-body dual-oxide dual-voltage transistor configuration is provided herein.

Figure 2:
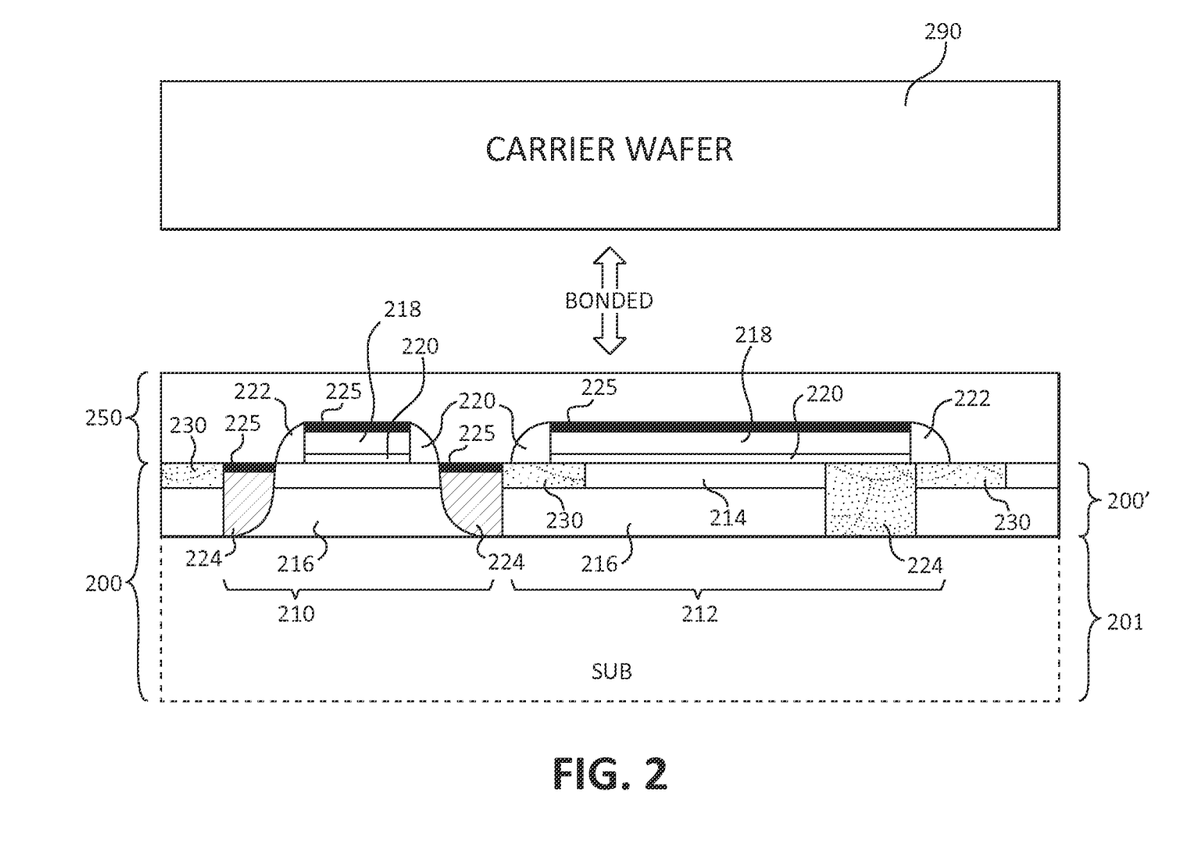
FIG. 2 is a cross-sectional side view of illustrative bottom-gate transistors prior to having their substrate thinned down in accordance with an embodiment.

FIG. 2 is a cross-sectional side view of illustrative bottom-gate transistors prior to having their substrate thinned down in accordance with an embodiment. As shown in FIG. 2, transistors 210 and 212 may be formed in a semiconductor substrate such as p-type substrate 200. In particular, FIG. 2 shows transistor 210 that is cut along a direction that is perpendicular to its width to expose its source-drain regions 224 and channel region 214, whereas transistor 212 is cut along a direction that is parallel to its width. A layer of salicide 225 may be formed on the source-drain regions 224 to help reduce the source-drain resistance and to help improve current flow through the associated channel regions. Source-drain regions 224 may be n+ diffusion regions (for n-channel transistors) or p+ diffusion regions (for p-channel transistors).

Each of transistors 210 and 212 may include a gate conductor 218 (e.g., a polysilicon gate structure or a metal gate structure) formed over channel region 214. When poly is used as gate material, a layer of salicide 225 may be formed on poly gate conductor 218 to reduce the poly resistance. A gate insulating layer 220 (e.g., a gate oxide layer) may be formed between gate conductor 218 and the surface of substrate 200. In accordance with some embodiments, transistors may be provided with two or more different gate oxide thicknesses to help support operation at two or more voltage levels. For example, 1.2V transistors may have a gate oxide thickness of 20 to 30 angstroms, whereas 2.5V transistors may have a gate oxide thickness of 60 to 80 angstroms. Spacer structures 222 (e.g., oxide gate spacers) may laterally surround the gate conductors 218. Lightly-doped drain (LDD) and/or halo implants may be performed after gate formation to further control the behavior of the channel region 214. A dielectric layer 250 (e.g., an oxide layer) may be formed on the gate structures over substrate 200.

At least two different types of shallow trench isolation (STI) structures may be formed in substrate 200. Shallower shallow trench isolation structures 230 (SSTI) may extend from the surface of substrate 200 to a first depth that is as deep as the channel regions 214, whereas deeper shallow trench isolation structures 240 (DSTI) may extend from the surface of substrate 200 to a second depth that is greater than the first depth. Formed in this way, the shallower STI structures 230 may be used to provide isolation between adjacent transistors. The deeper STI structures 240 may be at least as deep as the source-drain regions 224.

The transistor bulk regions 216 (sometimes referred to as "body" regions) may have a doping level that defines the source-drain diffusion region isolation requirements of each transistor to prevent undesired punch-through and to provide low bulk conductivity when the body is subsequently thinned down. Bulk regions 216 may generally exhibit a different dopant concentration than the channel regions 214. The bulk doping levels may be used to adjust break-down voltages, if desired. Channel regions 214 for transistors supporting different operating voltages may be doped differently to tune the threshold voltages.

After formation of the dielectric planarization layer 250, all high temperature processing steps may be complete. The wafer may then be bonded upside-down to a carrier wafer such as carrier wafer 290 (e.g., a substrate wafer or another device wafer that includes one or more metal structures). After being bonded to carrier wafer 290, substrate 200 may be thinned down (e.g., by removing dotted substrate portion 201 and leaving intact portion 200'). The thickness of the thinned-down portion 200' may be defined by the thickness of the deeper STI structures 240. Thickness of the thinned-down substrate 200' may generally range from 500 to 5000 angstroms (as an example). If desired, DSTI structures 240 may also be formed from the back side after the substrate has been thinned down. When DSTI structures 240 are formed from the back side, it may overlap front side SSTI to form complete isolation of thin-body region 216.

Figure 3:
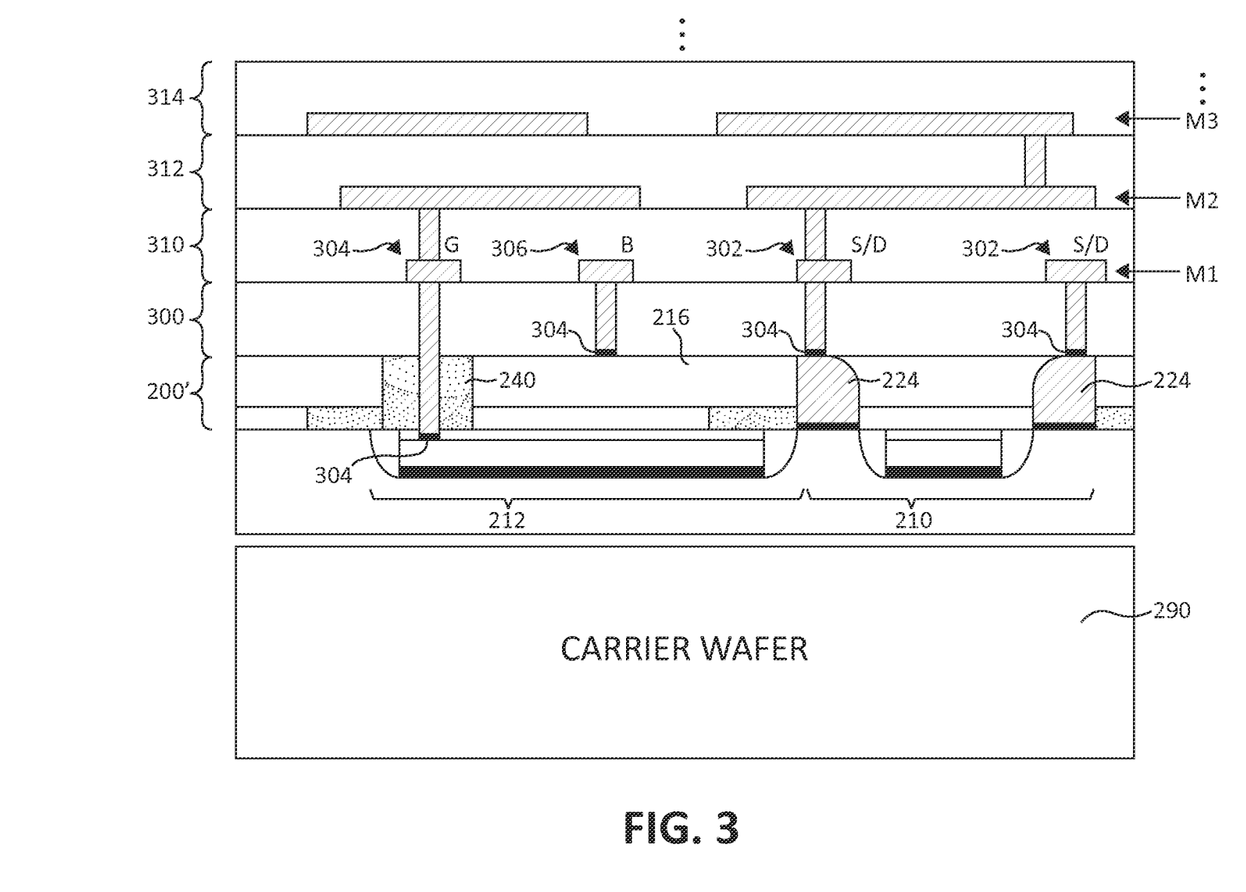
FIG. 3 is a cross-sectional side view of illustrative bottom-gate transistors having terminal contacts formed through a thin body in accordance with an embodiment.

After being bonded to another wafer and after having its body thinned down, additional metal routing layers may be formed on the back side of substrate 200' (see, e.g., FIG. 3). The surface of substrate 200' may be treated to remove any thinning related defects. As shown in FIG. 3, a first interlayer dielectric (ILD) layer 300 may be formed directly on substrate 200'. Transistor gate terminal contacts such as gate contact 304 may be formed through the deeper STI structures 240 (e.g., all bottom-gate contacts may be formed through DSTI structures 240). Transistor bulk terminal contacts such as body contact 306 may only extend through ILD layer 300 to make contact with bulk region 216 and may be positioned directly on top of the bottom-gate conductor 218 to maximize device density. If desired, the bottom gate contacts 304, and body contacts 306 may be in-situ salicided (i.e., the salicide is formed during deposition of the contact metal). For example, nickel, titanium, titanium nitride, or other suitable silicide material may first be deposited within an etched contact hole prior to the contact metal deposition to serve as a layer of "glue" for the contact metal.

The source-drain terminal contacts such as source-drain contacts 302 may also only extend through ILD layer 300 to make contact with the corresponding source-drain diffusion regions 224. If desired, the source-drain contacts 302 may be in-situ salicided. After the metal contact has been deposited and polished, a low temperature annealing process may be performed to trigger formation of the contact salicide at the silicon-silicide interface.

Thereafter, additional ILD layers 310, 312, and 314 may be formed over the transistor terminal contacts. The transistor terminal contacts and any associated routing path that are formed directly on ILD layer 300 in layer 310 may sometimes be referred to as a first metal (M1) metal routing layer. Metal routing structures formed in layer 312 may be referred to as a second metal (M2) metal routing layer. Similarly, metal routing structures formed in layer 314 may be referred to as a third metal (M3) metal routing layer. Alternating metal routing layers and interposing via layers formed in this way may sometimes be referred to collectively as a dielectric stack or an interconnect stack. In general, the dielectric stack may include any number of metal routing layers (e.g., the interconnect stack may include less than three metal layers, four or more metal layers, eight or more metal layers, etc.). Because gate 218 is formed below the body 216 and source/drain terminals 224 and because the substrate 200' is thinned down, transistors 210 and 212 may therefore sometimes be referred to as "bottom-gate thin-body" transistors.

Bottom-gate thin-body transistors configured in this way may exhibit lower junction capacitance (which yields improved switching performance without incurring excessive power consumption), complete vertical isolation (which prevents latch-up between n-well and p-well boundaries and helps to improved gate density), and improved bulk control since the body contact may be placed closer to channel in the substrate. The source and bulk terminals may also be shorted together to help the source follower transistor in a pixel to be less susceptible to body bias effects (to help improve transistor linearity).

Figure 4:
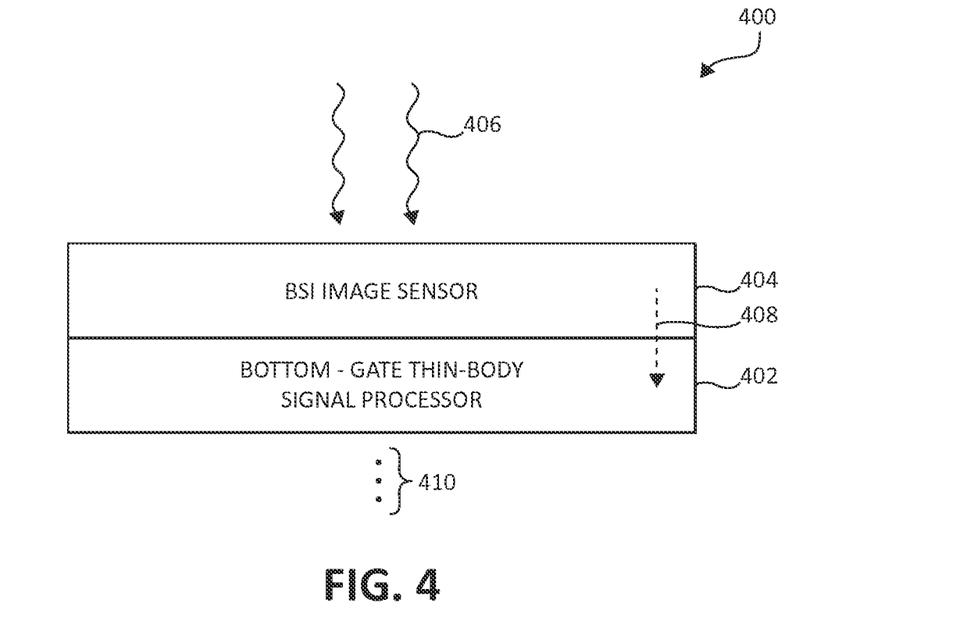
FIG. 4 is a diagram of an illustrative image system having stacked dies in accordance with an embodiment.

As alluded to above, the use of bottom-gate thin-body devices may be particularly suitable for stacked imaging systems. FIG. 4 shows an exemplary imaging system 400 that includes a backside illuminated (BSI) image sensor 404 that is stacked on top of a bottom-gate thin-body signal processor 402. BSI image sensor 404 may, for example, include photodiodes that receive incoming light 406 and that output corresponding analog signals to processing circuitry 402 for conversion and digital processing (as indicated by arrow 408). The ability for the bottom-gate thin-body wafer 402 to be stacked vertically with another wafer (e.g., wafer 404 in the example of FIG. 4) and to continue additional metallization processing steps may be referred to herein as "monolithic stacking," which reduces the need for multiple wafers to have their own separate set of routing layers while allowing the different wafers to be initially constructed using different processing technologies. If desired, system 400 may also include other stacked wafers/dies, as indicated by 410.

Figure 5:
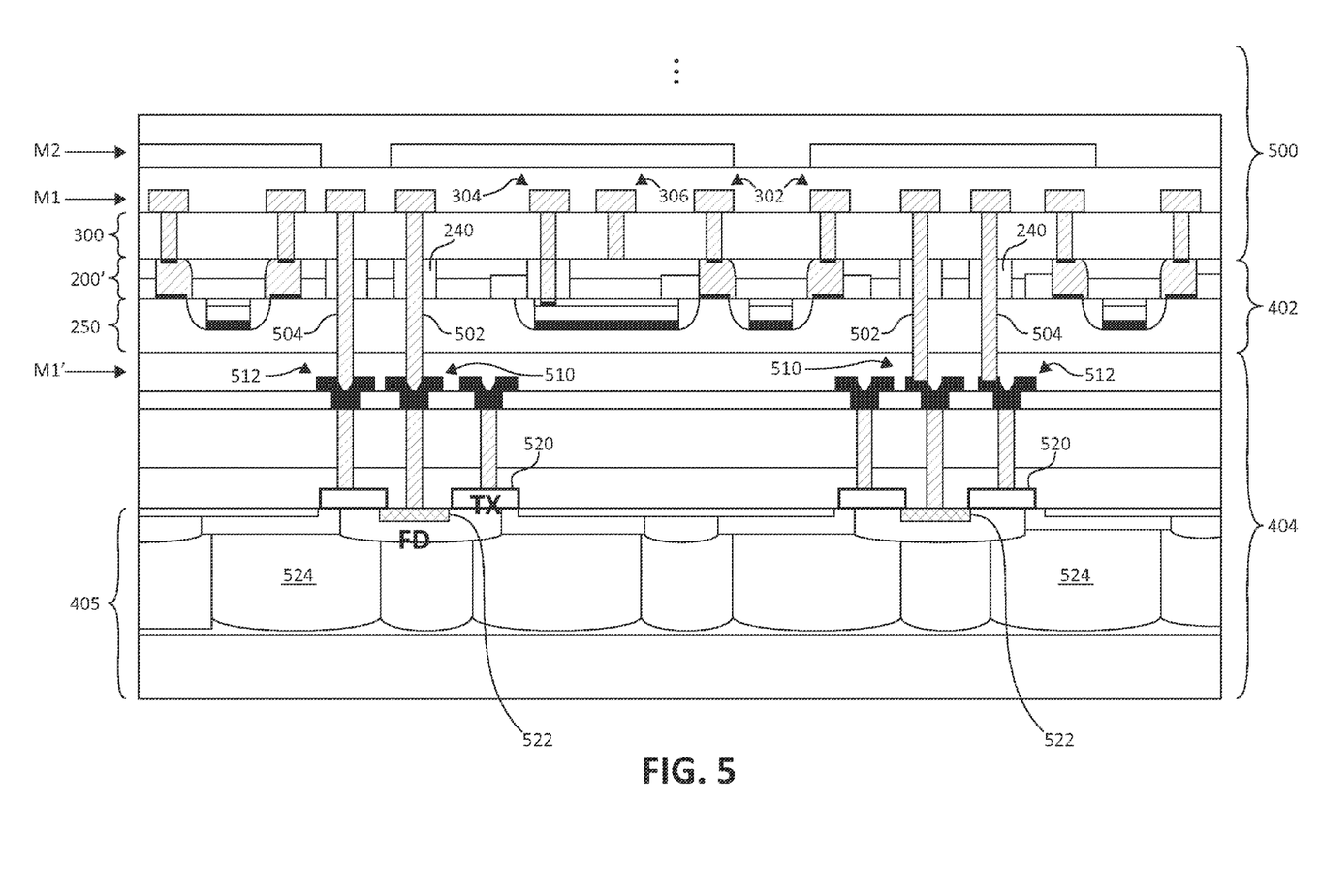
FIG. 5 is a cross-sectional side view showing how a first substrate having bottom-gate thin-body pixel trunk transistors may be stacked on a second substrate having photodiodes in accordance with an embodiment.

In accordance with one suitable embodiment, FIG. 5 shows an arrangement in which wafer 402 is stacked on wafer 404. As shown in FIG. 5, wafer 404 may include photosensitive elements such as photodiodes 524 and floating diffusion (FD) regions 522 formed in a substrate 405 and may also include gate structures such as charge transfer (TX) gate structures 520 that are formed on substrate 405. The floating diffusion regions 522 may be coupled to floating diffusion metal contacts 510, and charge transfer gate structures may be coupled to transfer gate metal contacts 512. Metal contacts 510 and 512 may serve as a first metal layer (M1') for wafer 404. In particular, the M1' metal layer may serve as the only metallization layer within wafer 404 (e.g., no additional metal layers need to be formed over M1' when fabricating wafer 404). While the FD regions and the TX gates are formed on wafer 404, other pixel transistors (e.g., reset transistors, source follower transistors, and row select transistors may be formed) may instead be formed on wafer 404.

Still referring to FIG. 5, wafer 402 may be bonded to wafer 404 at the surface of dielectric layer 250. As described above in connection with FIG. 2, the substrate of wafer 402 may be thinned after being bonded with wafer 404. After thinning substrate 200' to the desired thickness, an interconnect stack 500 can then be formed on the back surface of substrate 200'. Interconnect stack 500 (which is typically formed at lower processing temperatures) may be formed without interfering or degrading the integrated circuit structures previously formed as part of wafers 402 and 404. As shown in FIG. 5, the source-drain terminal contacts 302 and the body terminal contacts 306 may exhibit a first contact depth (i.e., a length that is substantially equal to the thickness of ILD layer 300), whereas the gate terminal contacts 304 may exhibit a second contact depth (i.e., a length that is substantially equal to the sum of the thickness of layer 300, thinned substrate 200', and the corresponding gate insulating layer) that is greater than the first contact depth. The transistor terminal contacts (e.g., contacts 302, 304, and 306) may be formed in the first metal layer M1 of the interconnect stack 500.

In accordance with an embodiment, inter-chip contacts having yet another contact depth that is greater than the second contact depth may be formed for electrically connecting the circuitry in wafers 402 and 404. As an example, a first inter-chip contact 502 may extend from the M1 layer of interconnect stack 500 into wafer 404 to make contact with a corresponding floating diffusion metal contact 510. As another example, a second inter-chip contact 504 may extend from the M1 metal layer of interconnect stack 500 into wafer 404 to make contact with a corresponding charge transfer gate metal contact 512. Such types of inter-chip contacts may also be formed through the deeper STI structures 240. These examples are merely illustrative. If desired, other inter-chip connections/contacts can be formed to provide electrical connection between wafers 402 and 404.

Bonded monolithically in this way, the M1 metal structures on wafer 402 and the M1' metal structures on wafer 404 may effectively share the same backend metallization layers (e.g., layers M2, M3, and so on in the dielectric stack 500). The TX gate decoding routing lines may be formed in the M1' metal routing layer, and only one row driver contact to the TX routing line may be necessary. Having the TX gate decoding routing formed locally in wafer 404 eliminates the need to have multiple inter-chip TX gate contacts and increases the local metal interconnect routing density within wafer 404, which makes room for much higher logic gate utilization within wafer 402. By forming only one shared interconnect stack 500 for both wafers 402 and 404, duplicate steps for forming expensive metallization layers for both stacked wafers are avoided and can help substantially drive down manufacturing cost.

Figure 6:
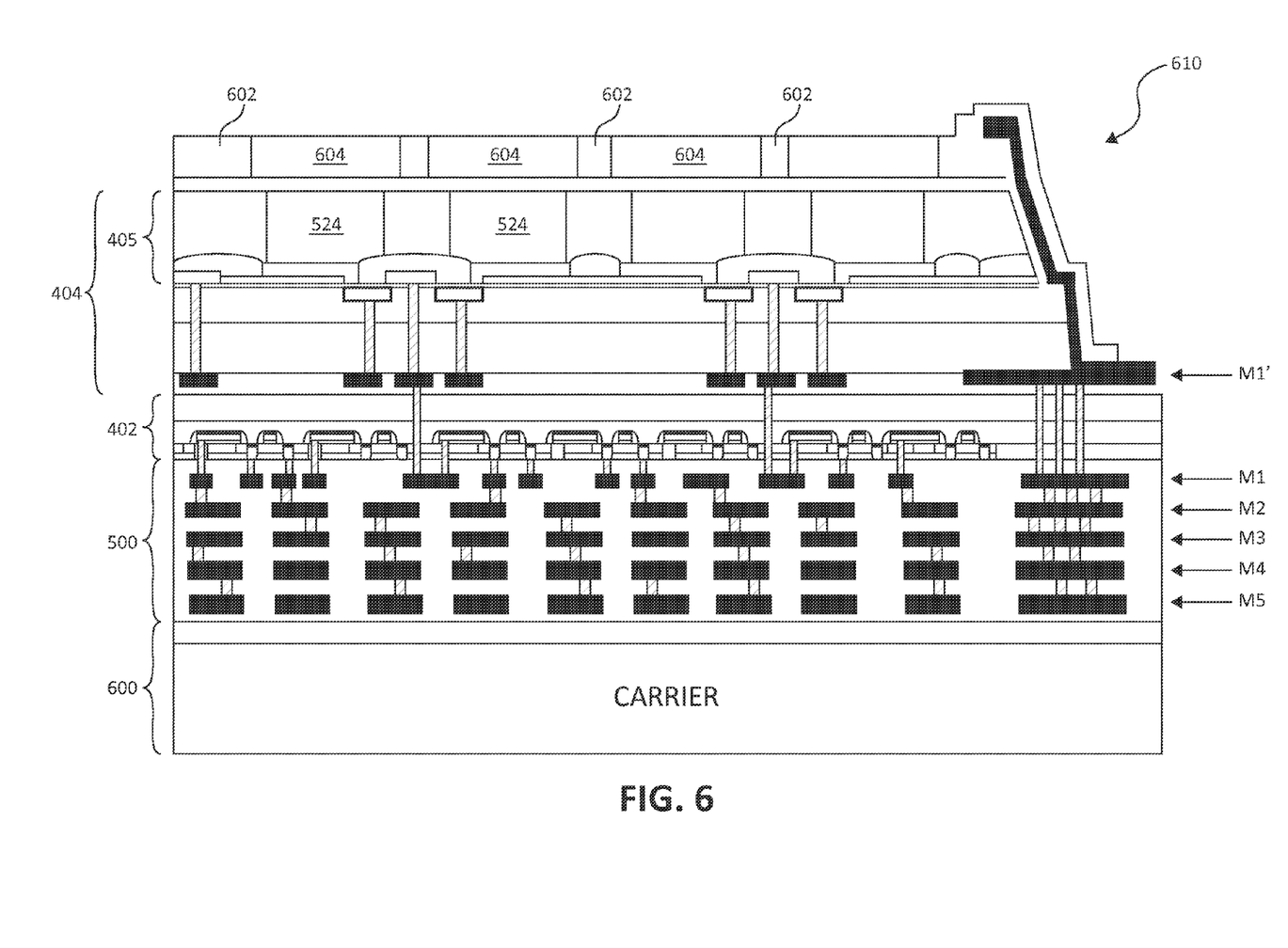
FIG. 6 is a cross-sectional side view of a stacked bottom-gate thin-body image sensor having a first bonding configuration in accordance with an embodiment.

The stackup of FIG. 5 may be bonded to a carrier wafer, then turned upside down and wafer 404 may thinned down so that photodiodes 524 are closer to the back surface of substrate 405. This thickness is a pre-determined thickness and the photo-diode 524 depth and doping are optimized for that depth. The final thickness of thinned wafer 404 may be around two to three microns (as an example). FIG. 6 shows a cross-sectional side view illustrating how a through-silicon via (TSV) 610 may be formed through wafer 404 to connect any metal structures at the back side of wafer 404 to the M1' metal layer and to the metal layers in interconnect stack 500 (e.g., through the inter-chip contacts). A portion of the TSV 610 may be exposed to serve as a bond pad region for receiving a bonding wire. Color filter elements 604 (e.g., green color filters, red color filters, blue color filters, etc.) may be formed directly over each photodiode 524. The color filter elements 604 may optionally be formed in color filter housing structures 602 (sometimes referred to collectively as color filter array in a box or "CIAB" structures). Microlenses may be built directly over the color filter array.

The example of FIG. 6 in which interconnect stack 500 includes five (i.e., M1-M5) metal routing layers is merely illustrative and does not serve to limit the scope of the present invention. In general, interconnect stack 500 may include any suitable number of metallization layers to provide the desired routing capability for the stacked imaging system. The stacked image sensor of FIG. 6 may further be mounted on another carrier wafer 600 (e.g., another active integrated circuit die that includes analog/digital circuitry or a carrier substrate that merely provides mechanical support for the entire stackup).

Figure 7:
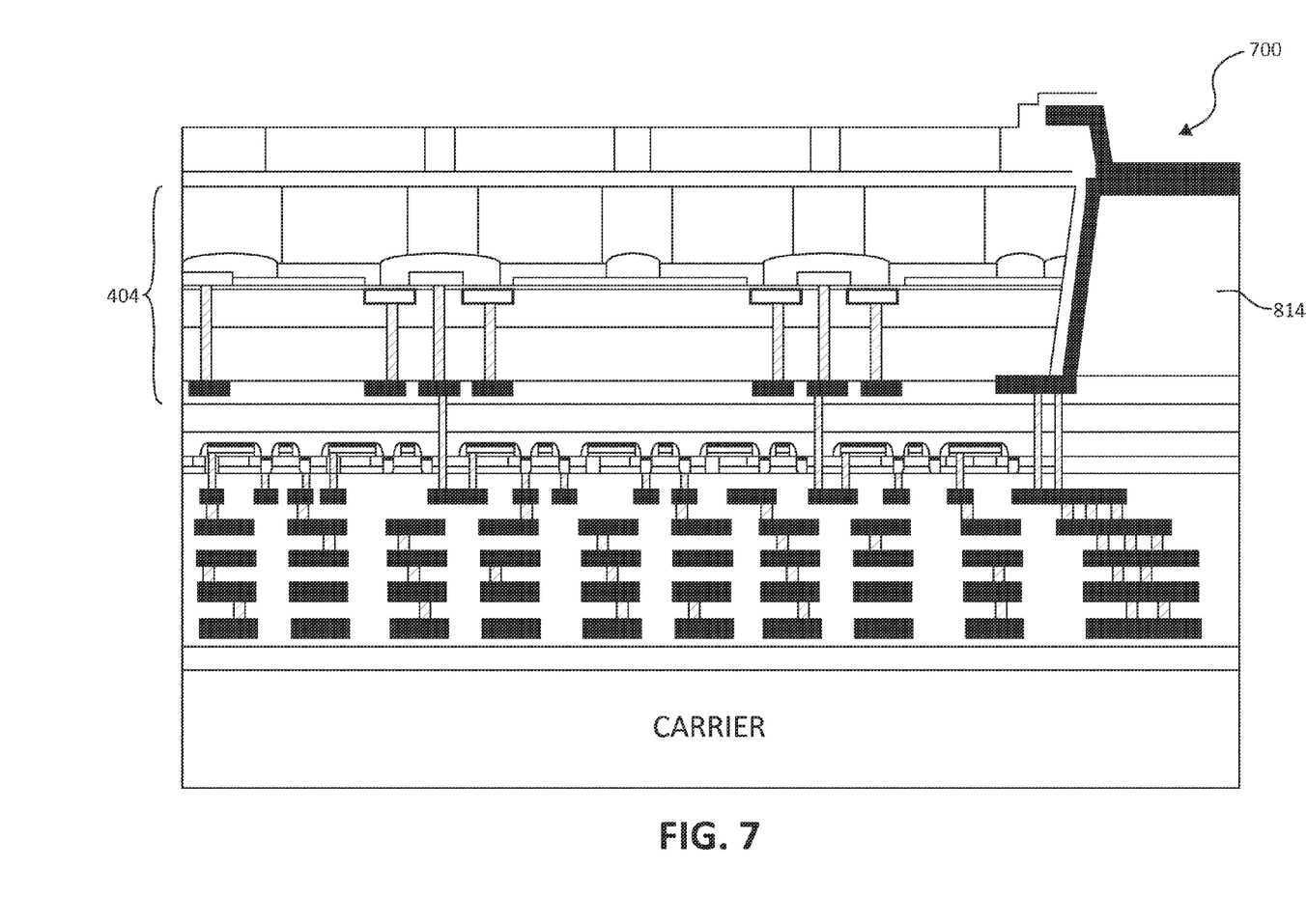
FIG. 7 is a cross-sectional side view of a stacked bottom-gate thin-body image sensor having a second bonding configuration in accordance with another embodiment.
Figure 8A:
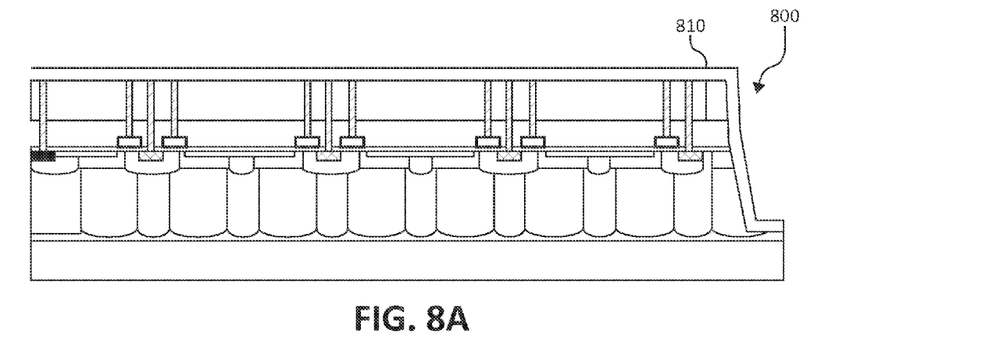
FIGS. 8A, 8B, and 8C are diagrams illustrating how the bonding configuration of FIG. 7 can be manufactured in accordance with an embodiment.
Figure 8B:
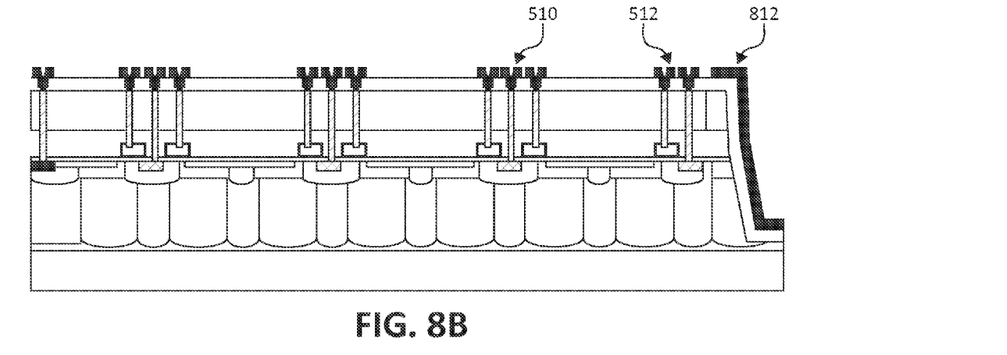
Figure 8C:
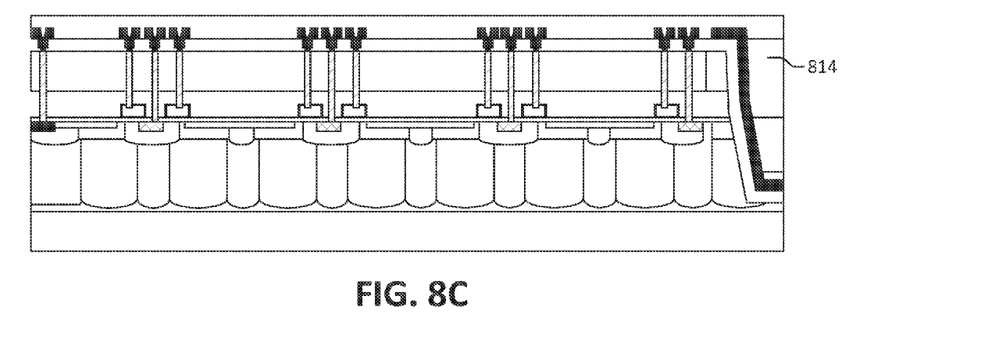

FIG. 7 shows another suitable arrangement that obviates the need for a TSV 610 that traverses the entire wafer 404 from the back-side of wafer 404. It is well known in the art that TSV deep-silicon etching requires plasma processing that can causes voltage induced electrical stress damage of gate oxides, which leads to reliability degradation. FIGS. 8A, 8B, and 8C are diagrams illustrating how the bonding configuration of FIG. 7 can be manufactured in accordance with an embodiment. FIG. 8A illustrates a snapshot in time at which the floating diffusion node contact holes and the TX gate contact holes have just been filled with metal (e.g., when the contact holes have just been filled with tungsten). After the contact hole fill, a portion of wafer 404 may be removed (i.e., etched away) to form trench 800. During this silicon trench 800 etch, the bulk substrate wafer is directly in contact with the bottom electrode of the plasma etching system thus preventing any voltage induced electrical stress damage in gate oxide. A layer of oxide 810 may then be deposited.

FIG. 8B illustrates how M1' metal structures may then be selectively patterned on oxide layer 810. For example, contacts 510 may be formed to make electrical contact with vias coupled to the floating diffusion regions. Similarly, contacts 512 may be formed to make electrical contact with vias coupled to the transfer gate structures. In particular, a metal layer 812 may be patterned that wraps along the bottom edge of trench 800. Oxide 814 may then be deposited and polished (see, e.g., FIG. 8C) to planarize the trench region.

The steps of FIGS. 8A-8C may be performed prior to thinning substrate 405 of wafer 404. FIG. 7 shows the resulting structure having an exposed bond pad region 700 that is substantially shallower compared to the configuration of FIG. 6. By reducing the depth of the bond pad in this way, the color filter array and microlens coating operations in subsequent steps can be performed with improved accuracy and uniformity.

Figure 9:
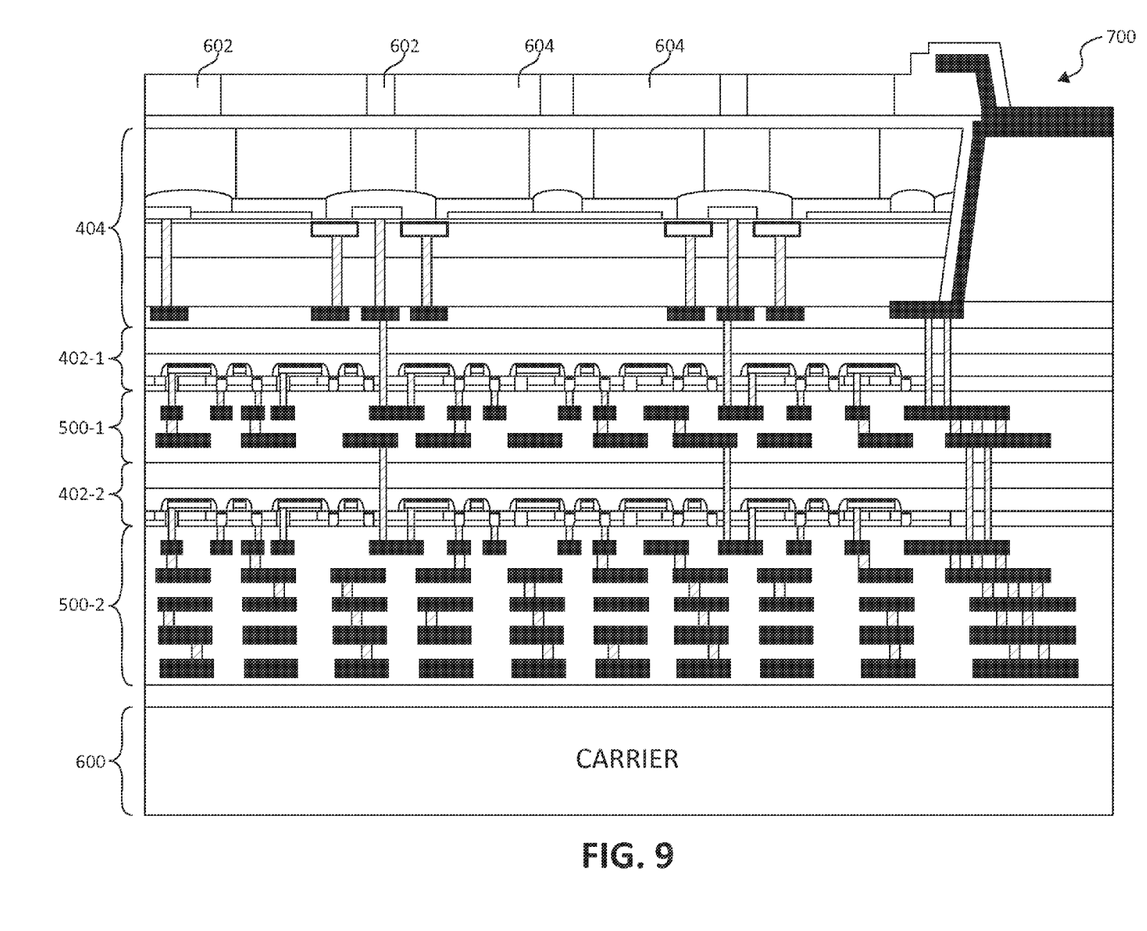
FIG. 9 is a cross-sectional side view showing how pixel structures may be distributed across at least three stacked substrate layers in accordance with an embodiment.

FIG. 9 shows another suitable embodiment where pixel structures may be distributed across at least three stacked substrate layers. Wafer 402-1 may first be bonded to wafer 404 as described above in connection with FIG. 5 and then metallization layers 500-1 may be constructed. Thereafter, another wafer 402-2 (e.g., a prefabricated wafer that also includes bottom-gate thin-body transistor structures) may be bonded to metallization layers 500-1. The substrate in wafer 402-2 may then be thinned body, and additional metallization layers 500-2 may be formed over the thinned body of wafer 402-2. Carrier wafer 600 may be attached to layers 500-2 to help provide mechanical support for the entire stackup during wafer 404 thinning and formation of bond pad 700. In general, the pixel wafer 404 may be monolithically bonded to any suitable number of thinned substrate layers (e.g., substrate layers having bottom-gate thin-body transistors and associated metallization layers). One familiar in the art will recognize that bottom-gate thin body transistor wafers can be stacked by bonding with no limitations to the number of stacked wafers.

Each of the different wafers may include different types of imaging circuitry. For example, photodiodes, charge transfer gates, and floating diffusion regions may be formed in the topmost backside illumination (BSI) wafer 404. Remaining pixel transistors such as the reset transistor, source follower transistor, and row select transistor may be formed in wafer 402-1. All other row/column control and peripheral circuitry such as such as analog-to-digital converters, sample/hold circuits, memory circuits, and digital signal processing circuits may be formed in wafer 402-2.

In general, the routing complexity may gradually increase with each monolithically bonded layer. For example in FIG. 9, wafer 404 may have one metal routing layer, wafer 402-1 may have two associated metal routing layers in stack 500-1, and wafer 402-2 may have five associated metal routing layers in stack 500-2. This is merely illustrative. In general, each stacked layer may include any desired number of metallization layers.

Formed in this way, the various different wafers may be fabricated using the most suitable technology nodes. In general, photodiodes in the top wafer 404 that does not include trunk transistors (i.e., reset transistors, source follower transistors, and row select transistors) can scale to smaller geometries without fill-factor impact and is easier to fabricate. It may utilize non-silicon substrates (for example wide band-gap material) to improve photo-diode characteristics. Trunk transistors in the middle wafer 402-1 operate at high voltages and typically do not scale as fast and can therefore be fabricated using older technology nodes. As a result, cheaper processing nodes can be used to fabricate wafers 404 and 402-1, whereas wafer 402-2 on which high complex digital signal processing circuitry is formed may be fabricated using state-of-the-art processing nodes.

Figure 10:
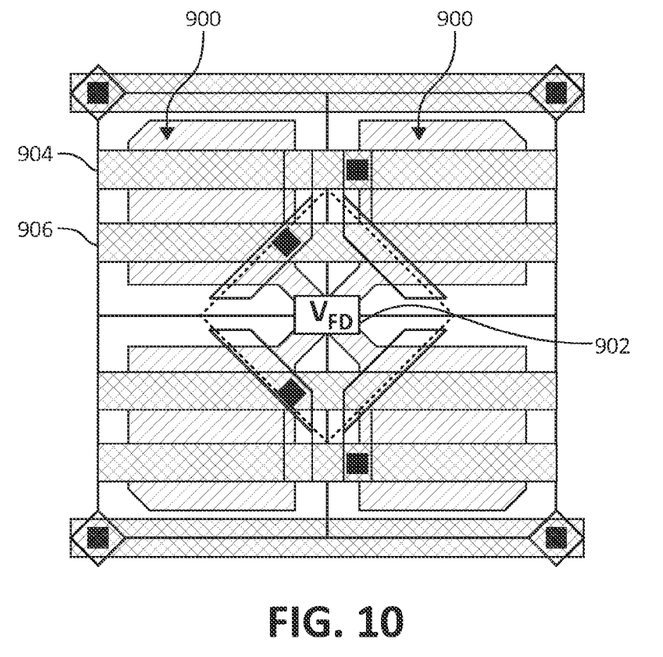
FIG. 10 is a top layout view of a four-pixel unit cell in the top layer of the stacked arrangement of FIG. 9 in accordance with an embodiment.

FIG. 10 is a top layout view of a four-pixel unit cell in the top layer (e.g., wafer 404) of the stacked arrangement of FIG. 9 in accordance with an embodiment. As shown in FIG. 10, the four-pixel unit cell may include four photodiodes 900 and may have four TX gate lines (shown as row lines) and only one contact 902 to the floating diffusion node that is shared among the four pixels. Each TX gate line, such as row line 904, may access one TX gate per unit cell, making contact to every unit cell in the row direction. The TX gate line 904 may be driven by a row-driver that has to access a row at any one point along that row and can be done anywhere along line 904. Similarly, a ground line 906 may also access one ground node per unit cell, and may tap into ground diffusion and/or ground bus at either end of a row. At the edge of the array, vertical gates line formed in the M1' metal layer can strap the horizontal ground lines 906 and only a few distributed ground contacts are need to power this ground plane.

Figure 11:
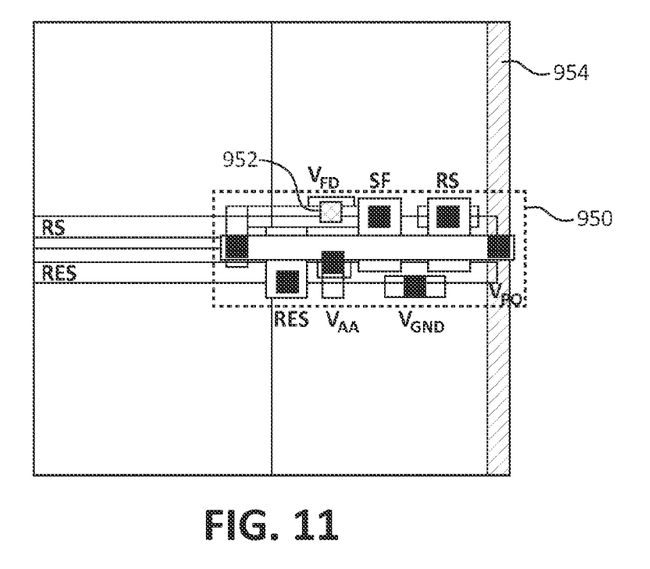
FIG. 11 is a top layout view of pixel transistors in the middle layer of the stacked arrangement of FIG. 9 in accordance with an embodiment.

FIG. 11 is a top layout view of pixel transistors in the middle layer (e.g., wafer 402-1) of the stacked arrangement of FIG. 9 in accordance with an embodiment. As shown in FIG. 11, pixel block 950 may include a reset transistor (i.e., a transistor having a gate that is controlled by reset signal RES), a source follower (SF) transistor, and a row select transistor (i.e., a transistor having a gate that is controlled by row select signal RS). The pixel block 950 may be powered using global power supply voltages $V_{AA}$ and $V_{GND}$. Contact 952 may be coupled to the floating diffusion node in the pixel wafer 404. Any remaining area outside pixel block 950 may be used to form analog-to-digital (A/D) converting circuits and logic transistors. The A/D and logic circuits formed in this way may directly overlap with at least some of the photodiodes in the upper wafer. Deeper STI structures 240 may be formed around the perimeter of pixel block 950 to help isolate the pixel trunk transistors from the analog/logic transistors. In the example of FIG. 11, two horizontal metal lines are used for reset (RES) and row-select (RS) signals, whereas vertical metal line 954 may be used to convey an output pixel signal. The unit cells of FIGS. 10 and 11 may be repeated such that the various logic circuits and A/D circuits are interspersed among the pixel blocks 950.

The configuration of FIGS. 10 and 11 in which four photodiodes share one pixel block is merely illustrative and does not serve to limit the scope of the present invention. If desired, pixel summing techniques may be applied by coupling two floating diffusion regions to additional switching transistors. In another suitable arrangement, four floating diffusion nodes may be coupled to capacitors formed in the middle wafer perform global shutter charge storage. In yet another suitable arrangement, volatile memory elements such as static random-access memory (SRAM) cells may be used to store pixel level shading and DC correction factors to help improve the final image quality.

Figure 12:
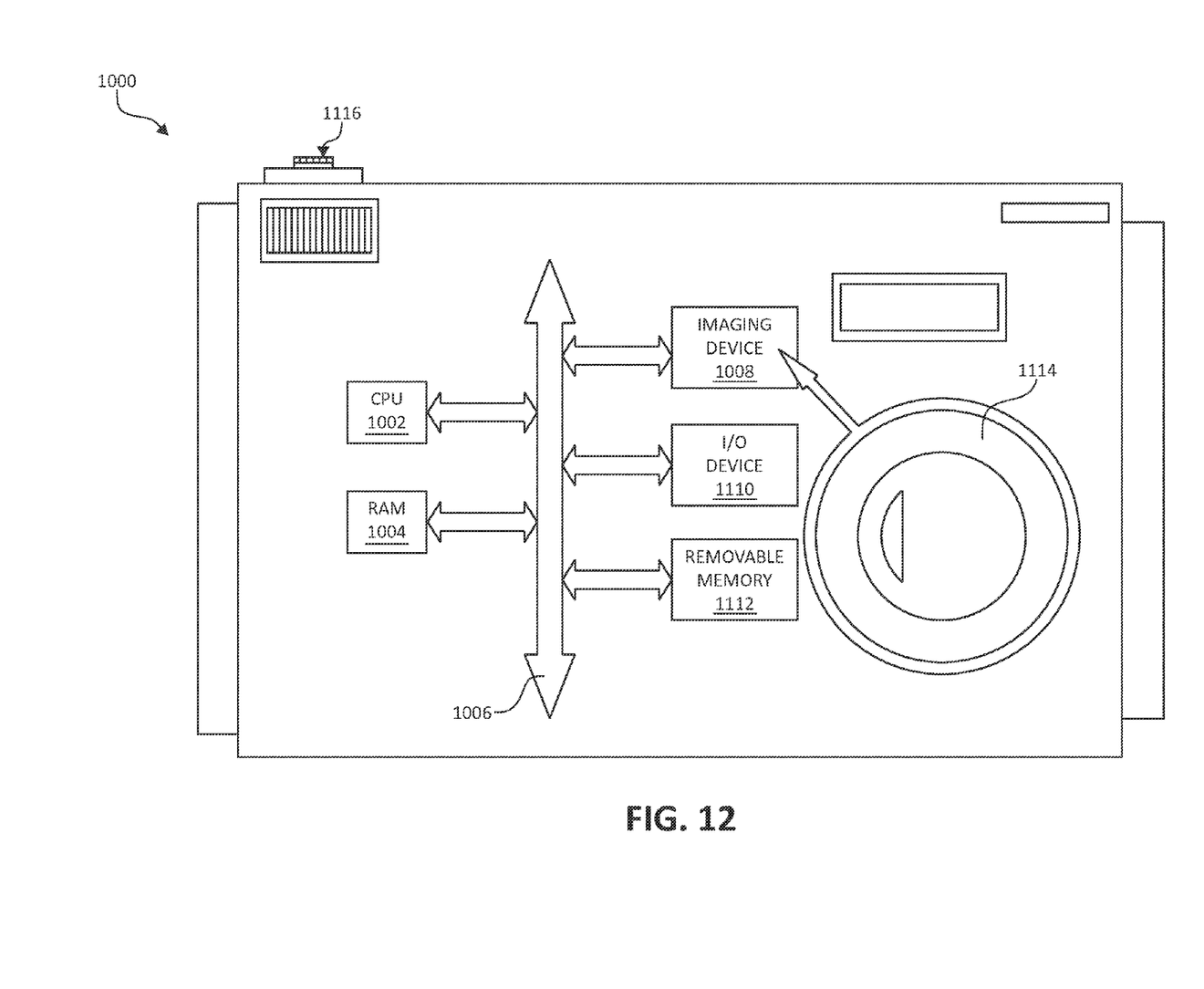
FIG. 12 is a block diagram of a system employing at least some of the embodiments of FIGS. 3-11 in accordance with an embodiment of the present invention.

FIG. 12 is a simplified diagram of an illustrative processor system 1000, such as a digital camera, which includes an imaging device 1008 (e.g., the camera module of FIG. 1) employing an imager having multiple monolithically stacked wafers at least one of which contains bottom-gate thin-body transistor structures. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In accordance with an embodiment, imaging circuitry is provided that includes a first substrate layer having photodiodes and floating diffusion regions, a second substrate layer that is bonded to the first substrate layer and that includes pixel transistors, and an interconnect stack formed on the second substrate layer, where the interconnect stack includes metal structures that are coupled to the floating diffusion regions in the first substrate layer and to the pixel transistors in the second substrate layer. In particular, the second substrate layer may be interposed between the first substrate layer and the interconnect stack. Only one metallization layer may be formed between the first substrate layer and the second substrate layer.

The imaging circuitry may further include a third substrate layer that is bonded to the second substrate layer and that includes digital signal processing circuits and an additional interconnect stack that is formed on the third substrate layer and that includes metal structures that are coupled to the pixel transistors in the second substrate layer. Transistor structures formed in the second and third substrate layers may be implemented using bottom-gate thin-body transistors. The first substrate layer may be configured as a backside illuminated (BSI) sensor. The second substrate layer may also include analog-to-digital converter circuits and logic gates, whereas the third substrate layer may also include digital memory elements. The components formed in the second and third substrate layers may, in general, be formed using different processing nodes.

In accordance with another embodiment, an imaging device may be provided that includes a first substrate layer in which photodiodes are formed and a second substrate layer that is bonded to the first substrate layer and that includes pixel transistors coupled to the photodiodes. The second substrate layer may also include analog-to-digital converter circuits and logic circuits interspersed among the pixel transistors. The logic circuits may be directly overlapping with at least some of the photodiodes in the first substrate layer. The pixel transistors in the second substrate layer may be grouped into discrete islands, and the logic circuits may surround each of the islands. The imaging device may also include a third substrate layer that is bonded to the second substrate layer and that includes memory circuits configured to store digital images captured using the photodiodes in the first substrate layer.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Imaging circuitry, comprising:
a first substrate layer that includes photodiodes and floating diffusion regions;
a second substrate layer that is bonded to the first substrate layer and that includes pixel transistors;
an interconnect stack formed on the second substrate layer, wherein the interconnect stack includes metal structures that are coupled to the floating diffusion regions in the first substrate layer and to the pixel transistors in the second substrate layer, and wherein the second substrate layer is interposed between the first substrate layer and the interconnect stack;
a third substrate layer that is bonded to the second substrate layer and that includes digital signal processing circuits; and
an additional interconnect stack that is formed on the third substrate layer and that includes metal structures that are coupled to the pixel transistors in the second substrate layer, wherein the pixel transistors in the second substrate layer are fabricated using a first technology node and wherein the digital signal processing circuits on the third substrate layer are fabricated using a second technology node that is different than the first technology node.

2. The imaging circuitry defined in claim 1, wherein the first substrate layer further includes charge transfer gate structures interposed between the photodiodes and the floating diffusion regions.

3. The imaging circuitry defined in claim 1, further comprising:
at least one metallization layer interposed between the first substrate layer and the second substrate layer.

4. The imaging circuitry defined in claim 1, wherein the pixel transistors comprise bottom-gate thin-body transistors.

5. The imaging circuitry defined in claim 1, wherein the first substrate layer has a first surface and a second surface, wherein the photodiodes are formed in the first surface of the first substrate layer, and wherein incoming light is received through the second surface of the first substrate layer.

6. The imaging circuitry defined in claim 1, wherein the third substrate layer includes digital memory elements.

7. A method of fabricating an image sensor, comprising:
forming photodiodes in a first wafer;
forming pixel transistors in a second wafer;
bonding the second wafer to the first wafer;
after bonding the second wafer to the first wafer, forming metallization layers on the second wafer;
forming digital signal processing circuits on a third wafer; and
after forming the metallization layers on the second wafer, bonding the third wafer to the metallization layers.

8. The method defined in claim 7, further comprising:
after bonding the third wafer to the metallization layers, forming additional metallization layers on the third wafer.

9. The method defined in claim 8, wherein forming metallization layers on the second wafer comprises forming a first number of metallization layers, and wherein forming the additional metallization layers comprises forming a second number of metallization layers that is greater than the first number of metallization layers.

10. The method defined in claim 7, further comprising:
forming at least one metallization layer in the first wafer.

11. The method defined in claim 7, wherein the second and third wafers each include a substrate, the method further comprising:
thinning the substrate of the second wafer; and
thinning the substrate of the third wafer after thinning the substrate of the second wafer.

12. The method defined in claim 7, further comprising:
forming a trench in the first wafer; and
lining the trench with metal to form a bond pad region.

13. A system, comprising:
a central processing unit;
memory;
a lens;
input-output circuitry; and
an imaging device, wherein the imaging device comprises:
a first substrate layer in which photodiodes are formed, wherein the first substrate layer also includes floating diffusion regions and charge transfer gate structures interposed between the photodiodes and the floating diffusion regions; and
a second substrate layer that is bonded to the first substrate layer and that includes pixel transistors coupled to the photodiodes, wherein the pixel transistors include at least one transistor selected from the group consisting of: a row select transistor, a source follower transistor, and a reset transistor, and wherein the second substrate layer also includes analog-to-digital converter circuits interspersed among the pixel transistors.

14. The system defined in claim 13, wherein each floating diffusion region is shared among multiple photodiodes.

15. The system defined in claim 13, further comprising:
logic circuits that are formed in the second substrate layer and that are formed directly overlapping with at least some of the photodiodes.

16. The system defined in claim 15, wherein the pixel transistors are grouped into discrete islands, and wherein the logic circuits surround each of the islands.

17. The system defined in claim 15, wherein the pixel transistors are arranged in discrete groups, and wherein the logic circuits surround each of the groups.

18. The system defined in claim 13, wherein the imaging device further comprises:
a third substrate layer that is bonded to the second substrate layer and that includes memory circuits configured to store digital images captured using the photodiodes in the first substrate layer.

19. The system defined in claim 13, wherein the pixel transistors are grouped into discrete islands.

20. The system defined in claim 13, wherein the pixel transistors are arranged in discrete groups.

* * * * *